United States Patent
Morikawa

(10) Patent No.: US 6,937,505 B2
(45) Date of Patent: Aug. 30, 2005

(54) NONVOLATILE MEMORY CELL AND NONVOLATILE SEMICONDUCTOR MEMORY DEVICE

(75) Inventor: Yoshinao Morikawa, Ikoma (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/729,718

(22) Filed: Dec. 5, 2003

(65) Prior Publication Data

US 2004/0114428 A1 Jun. 17, 2004

(30) Foreign Application Priority Data

Dec. 5, 2002 (JP) ........................................ 2002-353733

(51) Int. Cl.[7] .............................................. G11C 11/00
(52) U.S. Cl. .......................... 365/158; 365/97; 365/100
(58) Field of Search ......................... 365/158, 97, 100

(56) References Cited

U.S. PATENT DOCUMENTS

| 4,751,677 A | 6/1988 | Daughton et al. | |
|---|---|---|---|
| 6,169,688 B1 | 1/2001 | Noguchi | |
| 2002/0136053 A1 * | 9/2002 | Asano et al. | ............... 365/158 |
| 2004/0037106 A1 * | 2/2004 | Lu et al. | ........................ 365/96 |

FOREIGN PATENT DOCUMENTS

| EP | 1 109 170 | 6/2001 |
|---|---|---|
| JP | 2002-151661 | 5/2002 |

OTHER PUBLICATIONS

European Partial Search Report mailed Jun. 9, 2004 for European patent application No. EP 03 25 7635, 3 pages.

* cited by examiner

*Primary Examiner*—Huan Hoang
(74) *Attorney, Agent, or Firm*—Morrison & Foerster LLP

(57) ABSTRACT

It is an object of the present invention to make it possible to decrease the on-state resistance of a selection transistor of a memory cell without increasing the whole area of a memory cell array and accelerate and stabilize the reading operation of data stored in the memory cell. Therefore, a plurality of variable resistive elements capable of storing information in accordance with a change of electrical resistances is included, one ends of the variable resistive elements are connected each other, and an electrode of a selection element constituted by a MOSFET or diode element for selecting the variable resistive elements in common is connected with one end of each of the variable resistive elements to constitute a memory cell.

13 Claims, 21 Drawing Sheets

A—A Sectional View

B—B Sectional View

A-A Sectional View

B-B Sectional View

A—A Sectional View

B—B Sectional View

NONVOLATILE MEMORY CELL AND NONVOLATILE SEMICONDUCTOR MEMORY DEVICE

BACKGROUND OF THE INVENTION

1. Field of the Invention

The present invention relates to a nonvolatile semiconductor memory device and a memory cell used for the nonvolatile semiconductor memory device, more specifically to a nonvolatile semiconductor memory device having a variable resistive element in which a memory cell can store information in accordance with a change of electrical resistances.

2. Description of the Related Art

At present, an MRAM (Magnetic RAM), OUM (Ovonic Unified Memory), and RRAM (Resistance control nonvolatile Random Access Memory) are present and proposed as nonvolatile memories respectively using a variable resistive element capable of storing information in accordance with a change of electrical resistances. Each of these devices realizes a nonvolatile memory in the form of storing information by changing resistances and reading the information in accordance with a change of the resistance values. For example, the MRAM constitutes a memory cell by using an MTJ (Magnetic Tunnel Junction) device and its contents are disclosed in Japanese Unexamined Patent Publication No. 2002-151661. FIG. 16 shows a configuration of a portion of the memory cell relating to reading. Moreover, a configuration is described in the specification of Japanese Patent Application No. 2002-185234 by the applicant of this application as a memory cell configuration using an RRAM element. FIG. 17 shows the memory cell configuration. Though the memory cells shown in FIGS. 16 and 17 are different from each other in variable resistive element but they are common to each other in that selection transistors serving as a variable resistive element and a selection element respectively are connected in series. In the case of each memory cell, the gate of a selection transistor 3 is connected with a word line WL, one end of a variable resistive element 2 is connected with a bit line BL, the source of the selection transistor 3 is connected with a source line SL, and the other end of the variable resistive element 2 is connected with the drain of the selection transistor 3.

A case of a memory cell using an RRAM element is described below. FIG. 18 shows a memory cell array configuration when using the memory cell in FIG. 17. A memory array (the same meaning as a memory cell array) has a plurality of word lines WL and a plurality of source lines SL and a memory cell at a portion where a bit line BL intersects a word line WL and memory cells are arranged like a matrix. FIGS. 19A and 19B show schematic section views of the memory cell shown in FIG. 18.

The reading operation of the memory array is described below. A bit line selection transistor 4 and a word line driver 6 are controlled so that a memory cell to be read is selected by a bit line BL and a word line WL, and a source line control circuit 7 sets a source line SL connected to the selected memory cell to the ground potential. Under the above conditions, by applying a bias voltage for reading to a selected bit line from a charging circuit of a bit line of a reading circuit 5, a current route is formed in the range from a selection bit line to the RRAM element 2 of a selected memory cell, selection transistor 3, source line SL, and ground potential. The current circulating through the selection bit line is changed depending on the resistance value of the RRAM element 2 of the selected memory cell. The current circulating through the bit line is determined by the reading circuit 5 to output the data stored in the memory cell. FIG. 20 shows an example of a reading circuit for determining the current value. According to the reading circuit in FIG. 20, a load circuit 8 is connected to a bit line BL through the bit line selection transistor 4 to convert a bit line current into a voltage at a connection point N of the bit line selection transistor 4 and the load circuit 8. A current source for generating a reference current for determining each current value corresponding to the data value stored in the memory cell is prepared and a voltage generated by the current source (the voltage is hereafter referred to as a reference voltage Vref) and the voltage converted by the bit line current is determined by a comparator circuit 9 to output the determination result ($CP_{OUT}$). FIG. 21 schematically shows a load line (straight line) A when using a resistance as the load circuit 8 and current-voltage characteristics B and C of a bit line current corresponding to each binary data.

In the case of the above reading operation, the voltage difference input to the comparator circuit 9 increases as the bit line current difference increases as shown by the graph in FIG. 21. When the voltage difference input to the comparator circuit 9 is large, operations of the comparator circuit 9 are also accelerated. Therefore, to read information from a memory cell at a higher speed and more stably, it is preferable to increase the bit line current difference. In this case, the bit line current is obtained from the total value of resistance values of various portions through which the bit line current circulates, that is, the resistance of the RRAM element 2, on-state resistance of the selection transistor 3, on-state resistance of the bit line selection transistor 4, and wiring resistance (parasitic resistance) of a bit line BL. Therefore, when other resistances are larger than the resistance of the RRAM element 2, the above bit line difference is relatively decreased and a stable reading operation and high-speed operation become difficult.

FIG. 22 shows a simple model of a bit line current route. In FIG. 22, the model is constituted by the selection transistor 3 connected to the RRAM element 2, bit line selection transistor 4 for selecting a plurality of bit lines BL, and a bit line BL. It is enough that the number of bit selection transistors 4 is equal to the number of bit lines in order to select a plurality of bit lines BL. The number of bit selection transistors 4 is smaller than the number of the selection transistor 3 of a memory cell. Therefore, even if the driving capacity of a transistor is increased in order to decrease an on-state resistance, that is, the gate width of the transistor is increased, the influence of increase of the whole area of a memory array is small. Moreover, to decrease the resistance value of a bit line, there is a method of decreasing the wiring material of a bit line in resistance or length. Anyway, this is a problem common to nonvolatile memories. However, the situation is different for the selection transistor 3 in a memory cell. To improve the driving capacity of the selection transistor 3, it is effective to increase the gate width of the above transistor. However, when the transistor is connected to each RRAM element 2, a lot of transistors are required. Therefore, when increasing the gate width, the whole area of a memory array is increased and the manufacturing cost is greatly influenced. As a result, the on-state resistance of the selection transistor 3 is a big factor that the above bit line current difference cannot be increased.

SUMMARY OF THE INVENTION

The present invention is made to solve the above problems and its object is to provide a nonvolatile memory cell and a nonvolatile semiconductor memory device capable of decreasing the on-state resistance of a selection transistor of a memory cell without increasing the whole area of a memory array, accelerating and stabilizing the reading operation of data stored in the memory cell, and realizing stable operations.

To achieve the above object, a nonvolatile memory cell of the present invention has a plurality of variable resistive elements respectively capable of storing information in accordance with a change of electrical resistances, in which one ends of the variable resistive elements are connected each other and one electrode of a selection element for selecting the variable resistive elements in common is connected with the one ends of the variable resistive elements.

Moreover, in the case of a nonvolatile memory cell of the present invention, each of the variable resistive elements is an RRAM element whose electrical resistances are changed due to an electrical stress, MRAM element whose electrical resistances are change due to a magnetic field, or OUM element whose electrical resistances are changed due to heat.

Furthermore, in the case of a nonvolatile memory cell of the present invention, the selection element is constituted by a MOSFET and the electrode connected with one ends of the variable resistive elements is the drain or source of the MOSFET or the selection element is constituted by a diode element and the electrode connected with one end of each of the variable resistive elements is the anode or cathode of the diode element.

A nonvolatile semiconductor memory device of the present invention for achieving the above object has a memory cell array in which nonvolatile memory cells of the present invention are arranged like a matrix in the row direction and column direction, in which a word line extending along the row direction is formed in each row of the memory cell, and bit lines equal to the number of the variable resistive elements in the memory cell extending along the column direction are formed in each column of the memory cell.

Furthermore, in the case of a nonvolatile semiconductor memory device of the present invention, the selection element is constituted by a MOSFET in each of the memory cells, the drain of the MOSFET is connected with one end of each of the variable resistive element, the other end of each of the variable resistive element not connected with the MOSFET is connected with each of the bit lines, the source of the MOSFET is connected with a source line, and the gate of the MOSFET is connected with the word line.

Furthermore, in the case of a nonvolatile semiconductor memory device of the present invention, the selection element is constituted by a diode element, the anode or cathode of the selection diode is connected with one end of each of the variable resistive elements, one ends of the variable resistive elements not connected with the diode element are connected with the bit lines respectively, and the electrode of the diode element not connected with the variable resistive elements is connected with the word lines.

According to the above characteristic configuration, by sharing a selection element constituted by a MOSFET or a diode element with a plurality of variable resistive elements, it is possible to use a selection element layout region to be formed on each variable resistive element as one selection element layout region, it is possible to decrease the resistance value of the selection element without increasing the whole area of a memory array and increase the difference between bit line currents circulating through variable resistive elements selected correspondingly to stored data. As a result, it is possible to provide a nonvolatile memory cell and nonvolatile semiconductor memory device capable of accelerating and stabilizing the reading operation of data stored in a memory cell.

Furthermore, a nonvolatile semiconductor memory device of the present invention has a hierarchical bit line structure in which a plurality of blocks is set in at least the column direction by using the memory cell array as one block, the bit line of each of the blocks is used as a local bit line, a local bit line selection transistor for selecting the local bit line is used, and the local bit line is connected to a global bit line through the local bit line selection transistor.

By sharing a selection element with a plurality of variable resistive elements, it is possible to accelerate and stabilize the reading operation of data stored in a memory cell. However, because a leak current route via the variable resistive element of an unselected memory cell is formed between bit lines connected to a plurality of variable resistive elements respectively, the number of memory cells which can be connected to the same bit line has an upper limit.

However, according to the above characteristic configuration having the hierarchical bit line structure, it is possible to additionally set memory cells exceeding the upper limit in the bit line direction and construct a large memory array configuration while decreasing the resistance of a selection element.

Moreover, in the case of a nonvolatile semiconductor memory device of the present invention, the bit lines connected to the memory cells selected so as to be read are respectively charged up to a predetermined potential before the reading operation or a transistor for equalization is set between the bit lines in order to respectively charge the bit lines connected to the memory cells up to a predetermined potential before the reading operation.

Furthermore, according to the characteristic configuration, because each bit line is charged up to a predetermined potential before the reading operation, the reading operation is accelerated and stabilized, by decreasing the influence of the leak current and mainly reading a resistance change of a variable resistive element to be read by a selected memory cell, though a leak current route via the variable resistive element of an unselected memory cell is formed between bit lines connected to a plurality of variable resistive elements respectively.

DETAILED DESCRIPTION OF THE INVENTION (PREFERRED EMBODIMENTS)

Embodiments of a nonvolatile memory cell and a nonvolatile semiconductor memory device (hereafter properly referred to as "present invention device") are described below by referring to the accompanying drawings. Portions overlapped with a conventional nonvolatile memory cell and a nonvolatile semiconductor memory device are provided with the same symbols in drawings for description.

(First Embodiment)

Figure 1:
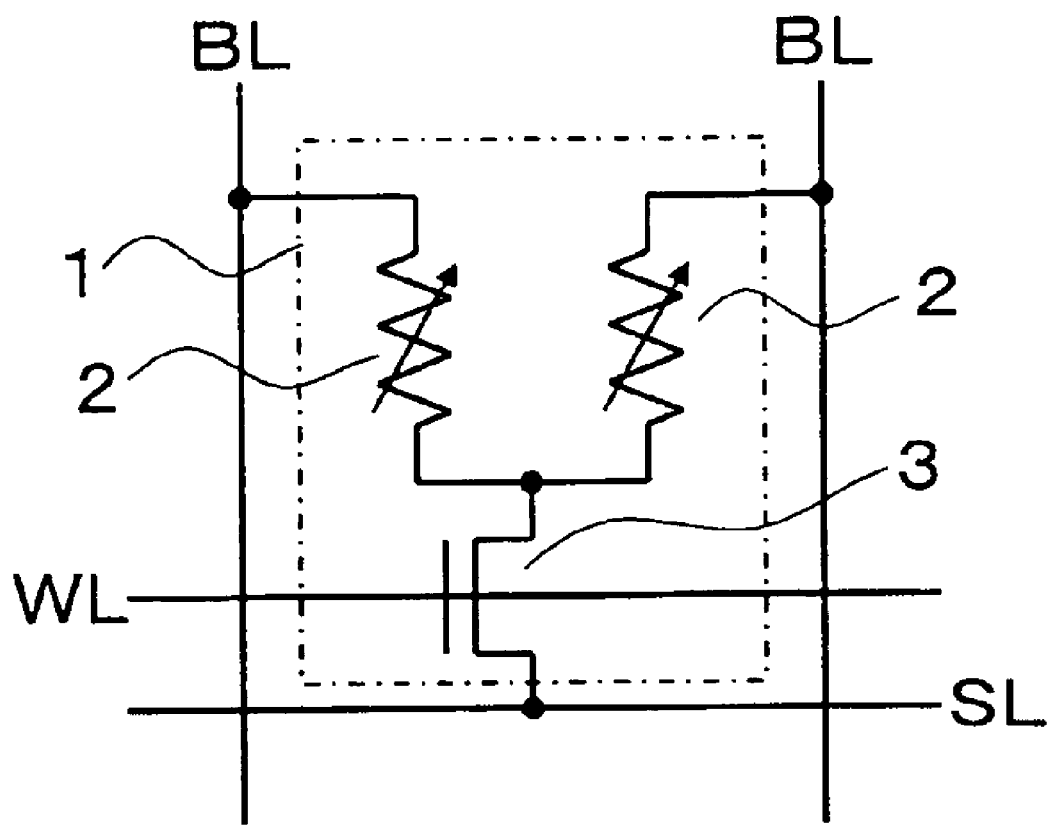
FIG. 1 is a circuit diagram showing a memory cell configuration of a nonvolatile semiconductor memory device of the present invention.
Figure 17:
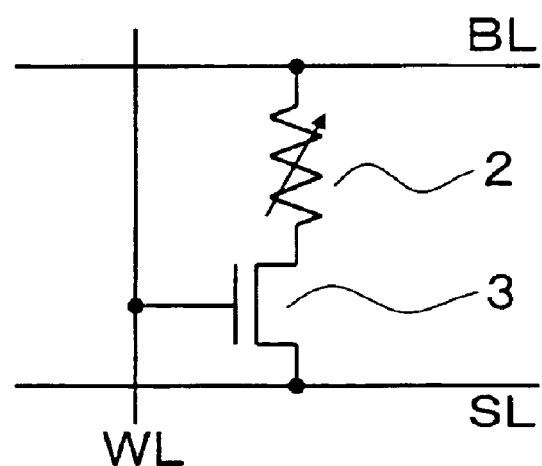
FIG. 17 is a circuit diagram showing a memory cell configuration using an RRAM element of a conventional nonvolatile semiconductor memory device.
Figure 18:
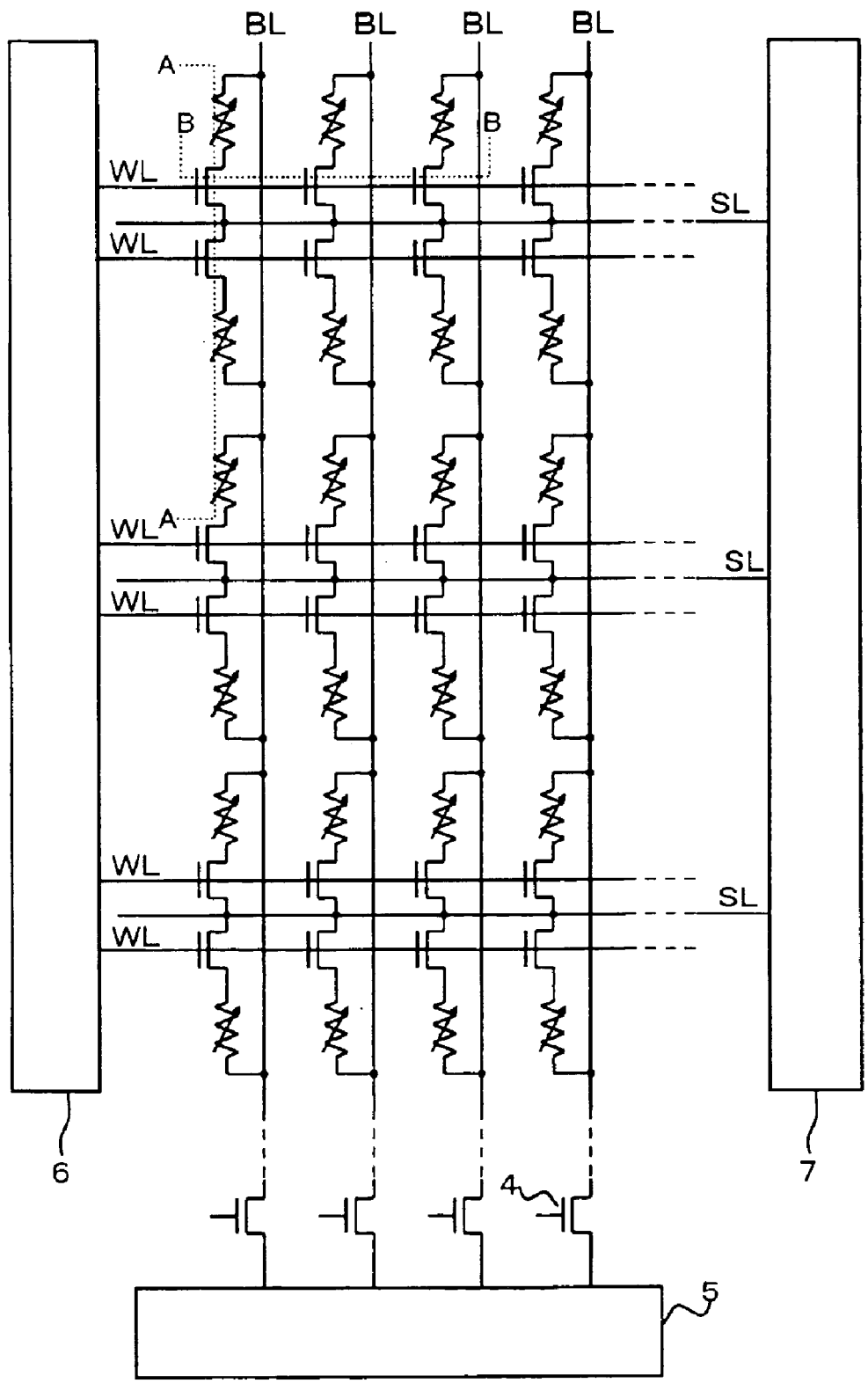
FIG. 18 is a circuit diagram showing a memory cell array configuration when using the memory cell shown in FIG. 17.

FIG. 1 shows a configuration of a memory cell 1 of the present invention device. The memory cell 1 has a selection transistor 3 constituted by two variable resistive elements 2 and one N-type MOSFET serving as a selection element for selecting the two variable resistive elements, in which one end of each variable resistive element 2 is connected to the drain electrode of the selection transistor 3. Moreover, other ends of variable resistive elements 2 are connected to different bit lines BL respectively, the gate of the selection transistor 3 are connected to word line WL and the source of the selection transistor 3 is connected to a source line SL. In the case of this embodiment, because one memory cell includes two variable resistive elements 2, there is a memory capacity two times larger than the memory capacity of the conventional memory cell shown in FIG. 17. However, when relating one memory cell to one variable resistive element 2, it can be said that the memory cell 1 of this embodiment is constituted by uniting two memory cells.

This embodiment uses an RRAM element as the variable resistive element 2. In the case of the RRAM element, electrical resistances are changed by applying an electrical stress and a changed electrical resistance is held even after canceling the electrical stress. Thereby, a nonvolatile memory device capable of storing data in accordance with the resistance change is constituted by forming a manganese oxide film made of any one of substances such as $Pr_{(1-x)}Ca_xMnO_3$, $La_{(1-x)}Ca_xMnO_3$, and $La_{(1-x-y)}Ca_xPb_yMnO_3$ (x<1, y<1, and x+y<1), for example, $Pr_{0.7}Ca_{0.3}MnO_3$, $La_{0.65}Ca_{0.35}MnO_3$, or $La_{0.65}Ca_{0.175}Pb_{0.175}MnO_3$ by the spin coating method, laser ablation, or sputtering method. Moreover, the resistance change value of the RRAM element is controlled by applying a voltage pulse between electrodes of the RRAM element as an electrical stress and adjusting the pulse width or voltage amplitude of the voltage pulse or the both of it.

Figure 2:
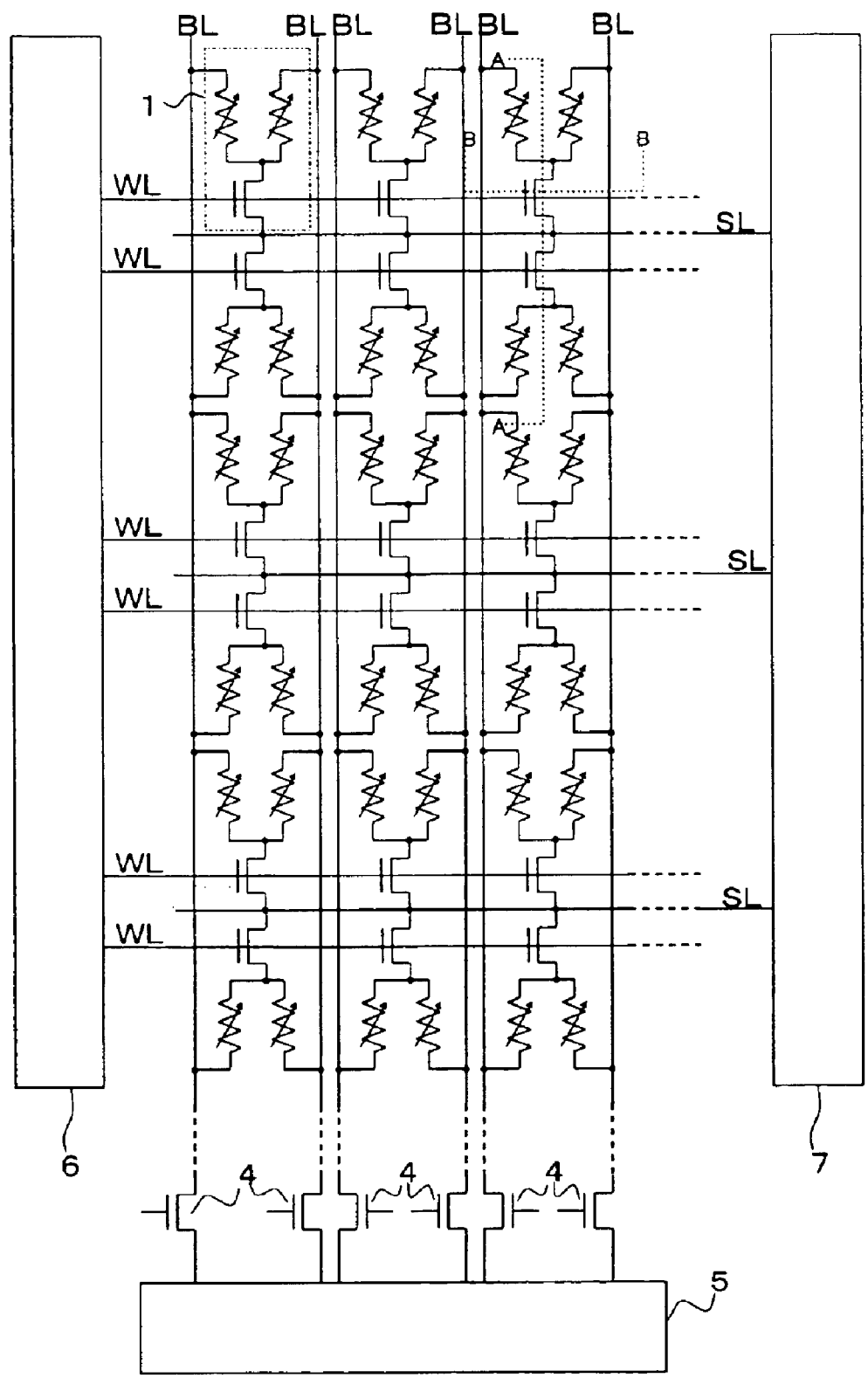
FIG. 2 is a circuit block diagram showing a configuration (first embodiment) of memory array of a nonvolatile semiconductor memory device of the present invention.

FIG. 2 shows a configuration of a memory array of the present invention. The memory array is constituted by arranging a plurality of memory cells 1 like a matrix in the row direction (word line direction) and the column direction (bit line direction) and moreover, has a plurality of bit lines BL, a plurality of word lines WL, and a plurality of source lines SL. A pair of adjacent bit lines BL and one word line WL intersect for one memory cell 1. In the case of each memory cell 1, the variable resistive element 2 connected to a pair of adjacent bit lines BL is connected to a source line SL by sharing the selection transistor 3. In this case, by turning on one of the bit line selection transistors 4 respectively constituted by an N-type MOSFET and thereby selecting one of the adjacent bit lines BL, the variable resistive element 2 connected to the selected bit lines BL is selected.

Figure 3A:
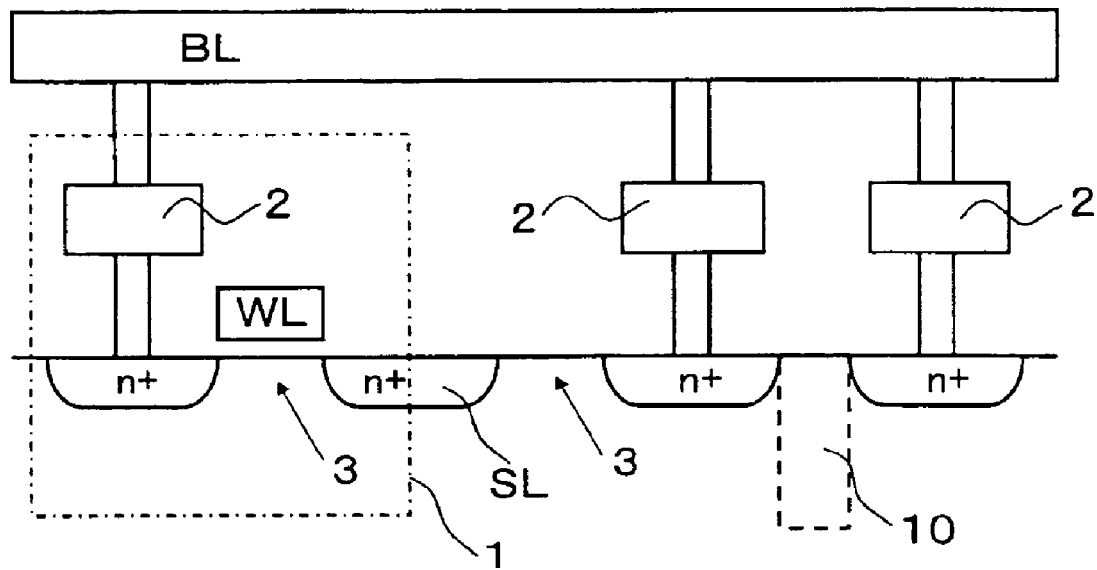
FIG. 3A is a sectional view schematically showing a cross section of an essential portion of the memory array configuration shown in FIG. 2 taken along the line A—A shown in FIG. 2.
Figure 3B:
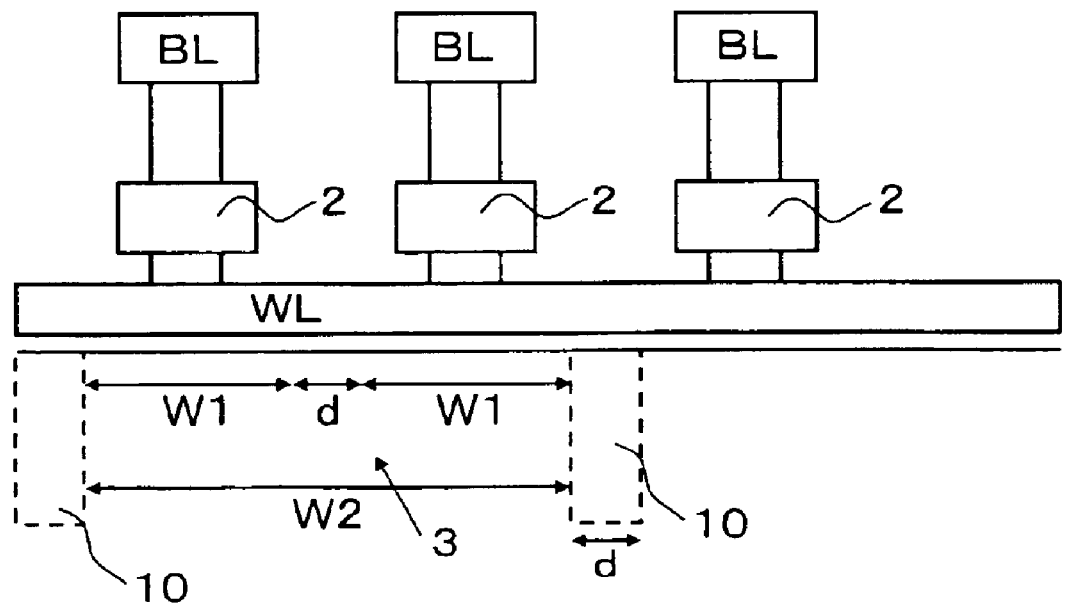
FIG. 3B is a sectional view schematically showing a cross section of an essential portion of the memory array configuration in FIG. 2 taken along the line B—B in FIG. 2.
Figure 19A:
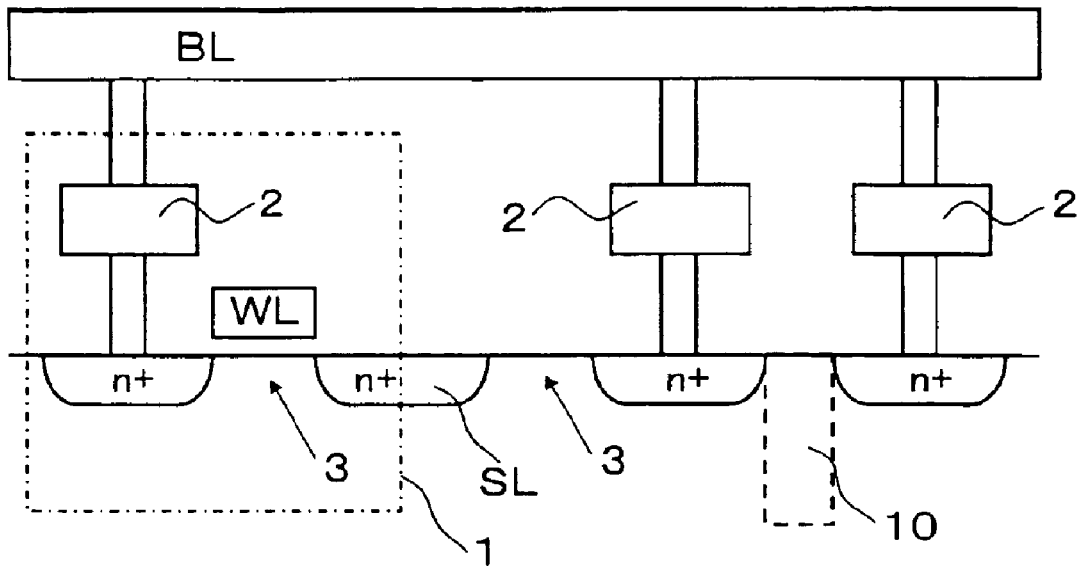
FIG. 19A is a sectional view schematically showing a cross section of an essential portion of the memory array configuration shown in FIG. 18 taken along the line A—A in FIG. 18.
Figure 19B:
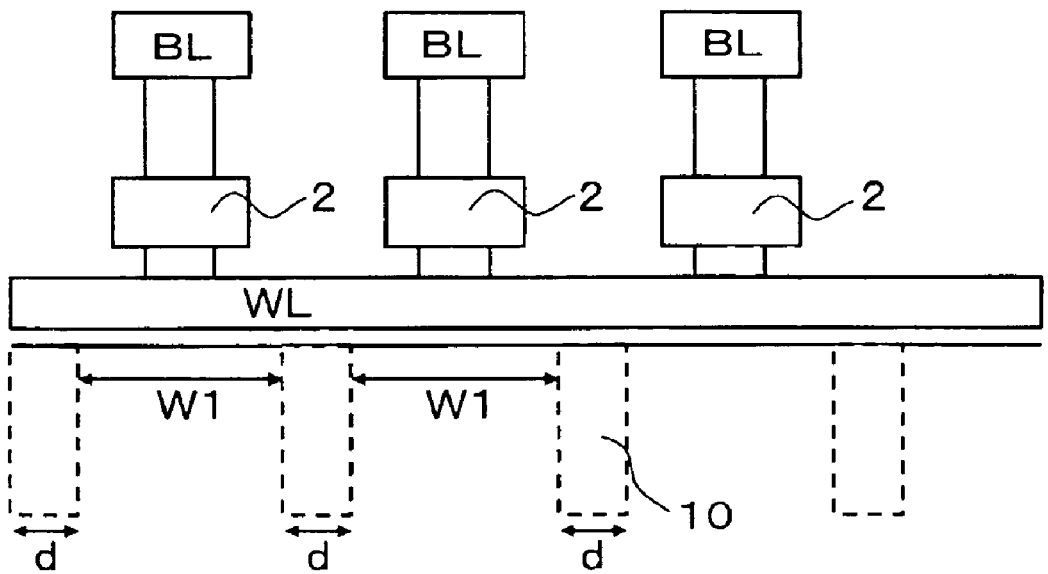
FIG. 19B is a sectional view schematically showing a cross section of an essential portion of the memory array configuration shown in FIG. 18 taken along the line B—B in FIG. 18.

FIGS. 3A and 3B schematically show sectional views of an essential portion of the memory array configuration shown in FIG. 2. In this case, as a result of comparing FIG. 3B with FIG. 19B of a conventional memory array configuration, it is found that the gate width (W2=2×W1+d) of the selection transistor 3 is two times or more large than the gate width (W1) of the conventional selection transistor 3. That is, two gate widths (2×W1)+width(d) of a device isolation region 10 becomes equal to the gate width (W2) of the selection transistor 3 of this embodiment. That is, in comparison with the prior art in FIG. 19, it is shown that the driving capacity of the selection transistor 3 is improved up to two times or more in the same layout area. As a result, it is possible to decrease the resistance value of the selection transistor 3 without increasing the whole area of a memory array and increase the current difference between stored data values of bit line currents circulating through the variable resistive element 2 (for example, in the case of binary data, current value difference between current value for reading data 0 and current value for reading data 1).

(Second Embodiment)

Figure 4:
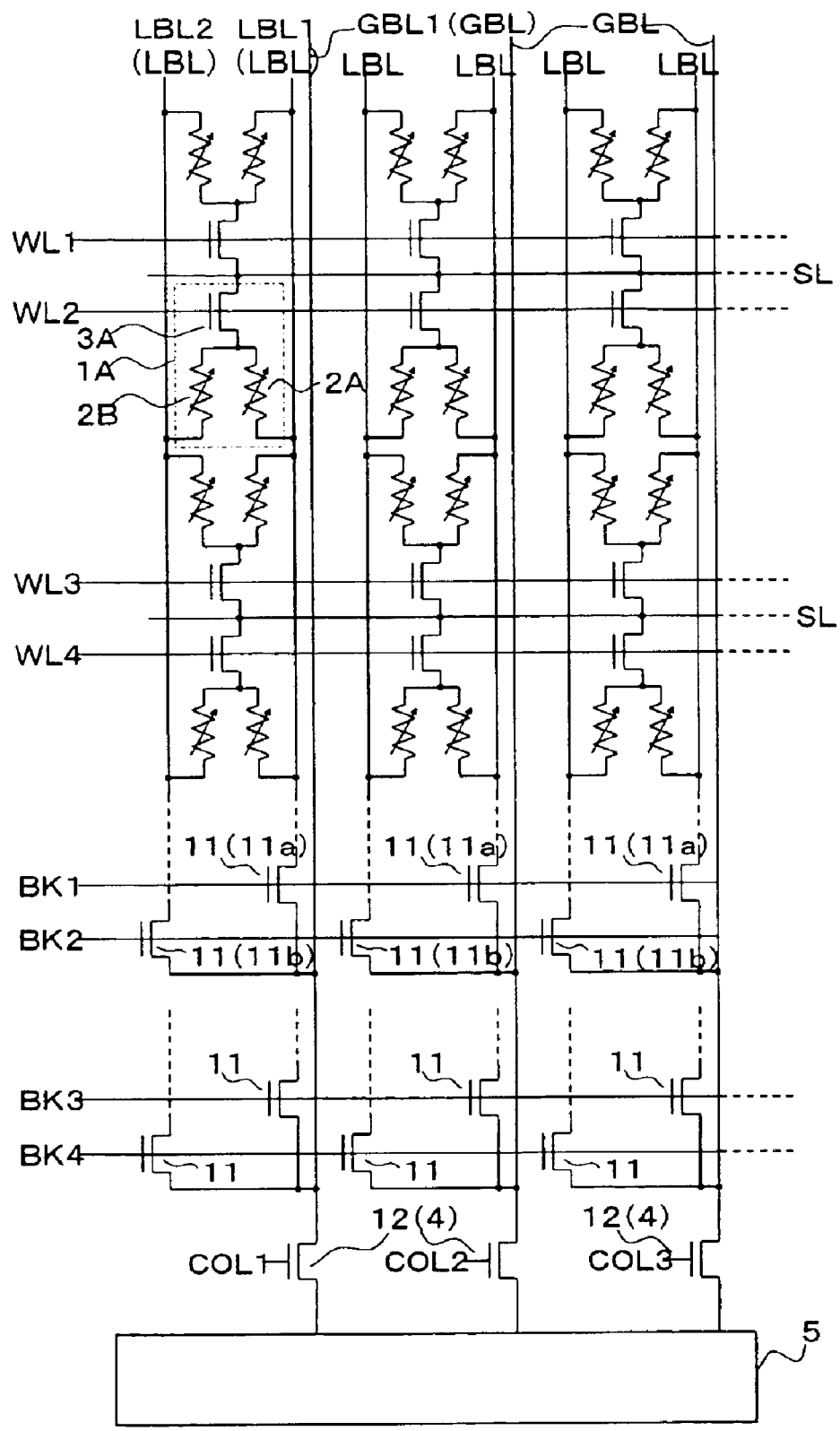
FIG. 4 is a circuit block diagram showing a configuration (second embodiment) of a memory array using a hierarchical bit line structure of a nonvolatile semiconductor memory device of the present invention.
Figure 5:
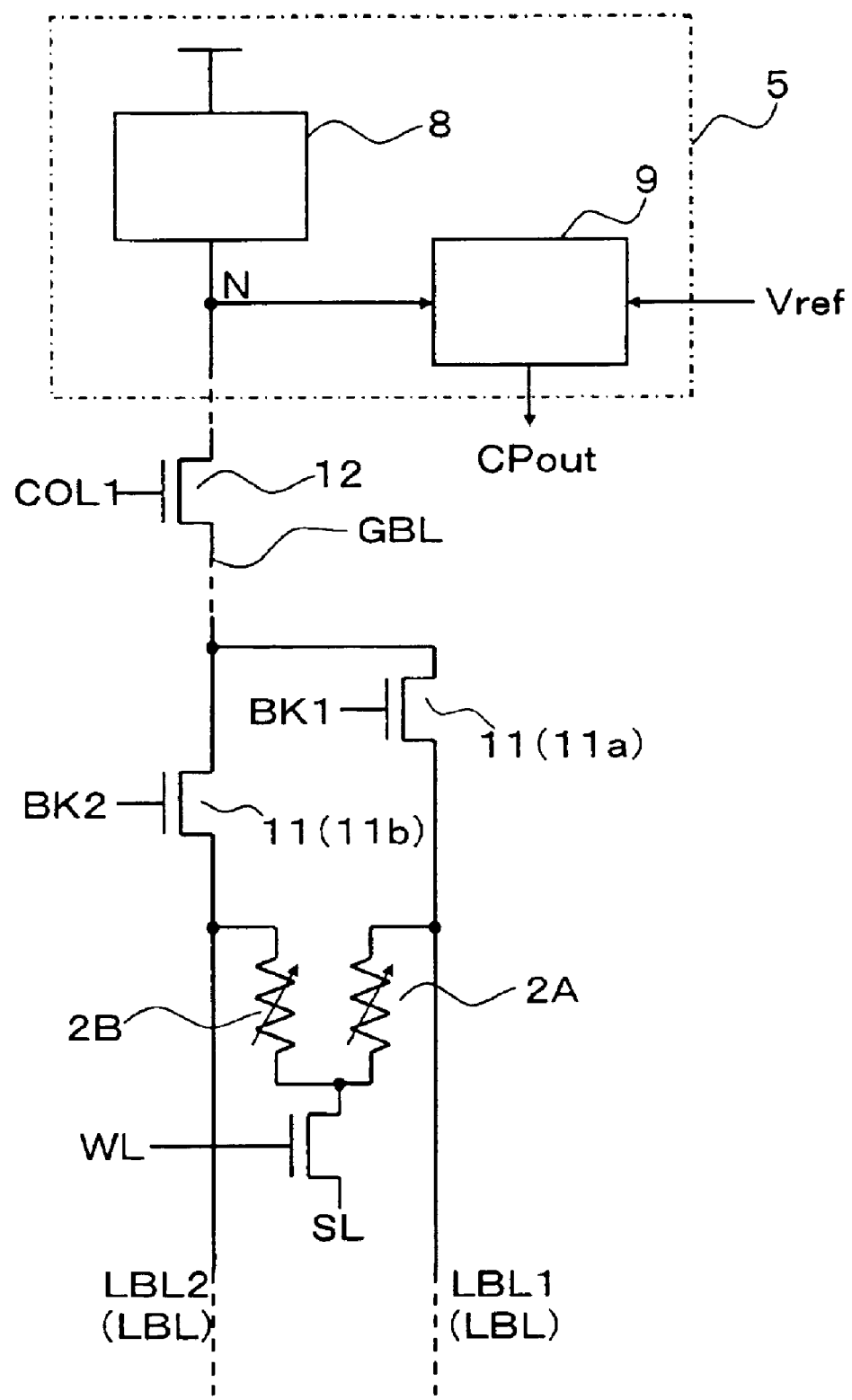
FIG. 5 is a circuit block diagram showing a reading circuit of the memory array configuration shown in FIG. 4.

FIG. 4 shows a memory array configuration using a hierarchical bit line structure on the basis of the memory array configuration shown in FIG. 2 and FIG. 5 shows a reading circuit in the hierarchical bit line structure. To realize stable reading of stored data from a memory cell 1 at a high speed and stability, it is possible to realize a memory array configuration having the hierarchical bit line structure shown in FIG. 4.

In the case of the hierarchical bit line structure of this embodiment, a bit line directly connected to the memory cell 1 is referred to as a local bit line LBL. A plurality of blocks is arranged in the column direction by assuming memory arrays connected the same local bit line LBL in the column direction as one block, a local bit line selection transistor 11 for selecting the local bit line LBL of each block is set, and the local bit line LBL is connected to a global bit line GBL through the local bit line selection transistor 11. Moreover, the global bit line GBL is connected to a reading circuit 5 through a global bit line selection transistor 12. In this case, by selectively turning on each local bit line selection transistor 11 and each global bit line selection transistor 12, a variable resistive element 2 to be read and the reading circuit 5 are connected each other through the local bit line LBL and global bit line GBL. Therefore, the local bit line selection transistor 11 and global bit line selection transistor 12 correspond to the bit line selection transistor 4 in the memory array of the embodiment shown in FIG. 2.

Figure 6:
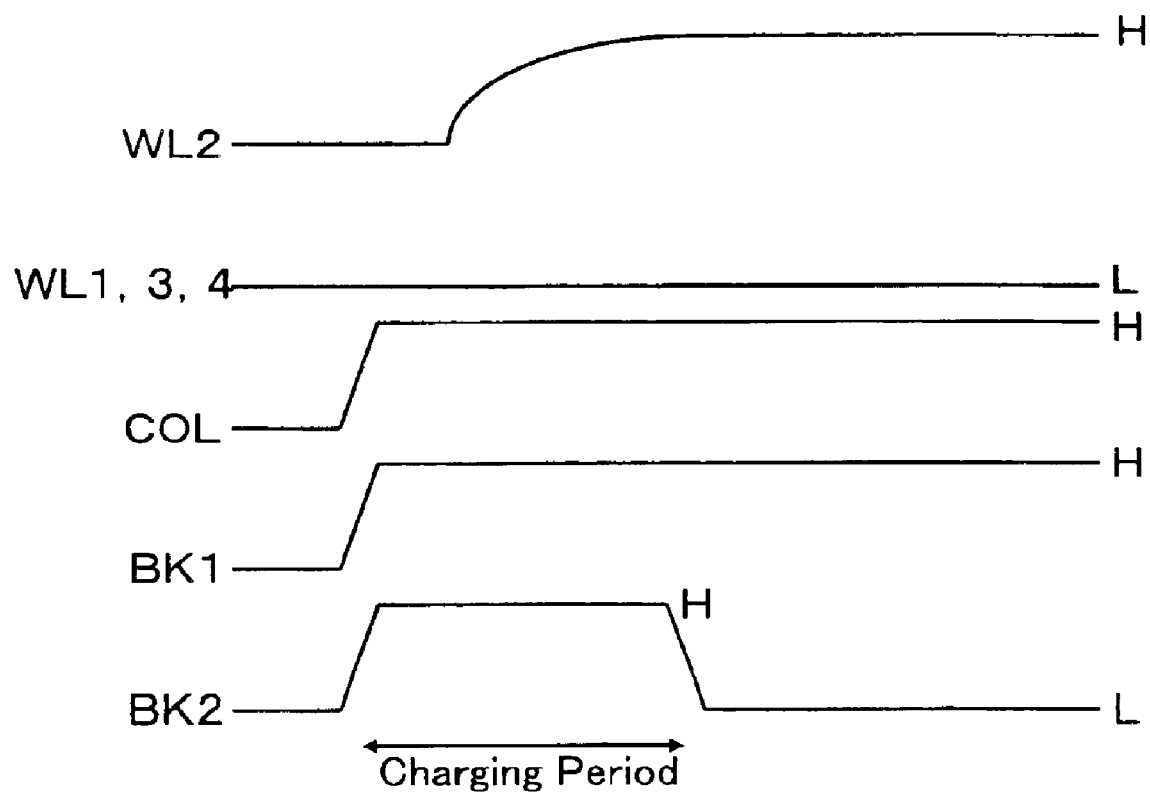
FIG. 6 is a signal timing waveform diagram for explaining the reading operation of the memory array configuration shown in FIG. 4.
Figure 20:
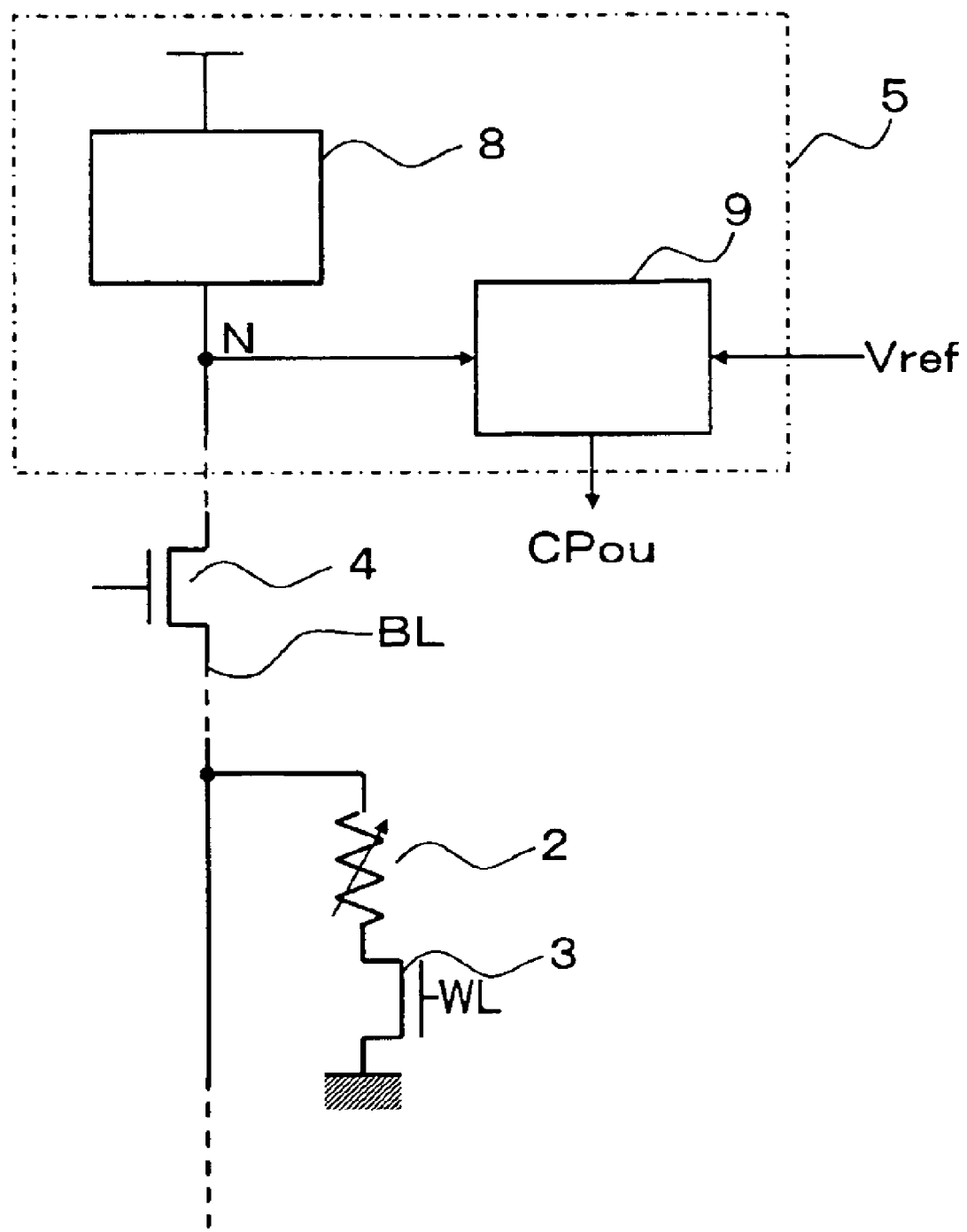
FIG. 20 is a circuit block diagram showing a reading circuit of a conventional nonvolatile semiconductor memory device.

The reading operation of the memory cell 1 is described below by referring to FIGS. 4, 5 and the signal timing waveform diagram shown in FIG. 6. In FIG. 4, the memory cell 1 to be read is assumed as 1A, a variable resistive element 2 to be read in the memory cell 1 is assumed as 2A, a variable resistive element 2 not to be read in the memory cell 1 is assumed as 2B, and a selection transistor 3 of the memory cell 1A is assumed as 3A. To turn on local bit line selection transistors 11a and 11b which connect to a local bit line LBL1 connected to the variable resistive element 2A and a local bit line LBL2 connected to the variable resistive element 2B respectively, local bit line selection signals BK1 and BK2 are made high-level. At the same time, to turn on the selection transistor 3A, a word line WL2 is made high-level. A source line SL connected to the memory cell 1A is set to the ground potential and a global bit line selection signal COL1 is made high-level in order to turn on the global bit line selection transistor 12 so as to select a global bit line GBL1 connected to local bit lines LBL1 and LBL2 through the local bit line selection transistors 11a and 11b. Under the above state, the selected global bit line GBL1 and local bit lines LBL1 and LBL2 are charged from a load circuit 8 in the reading circuit 5. A reading charge level to the selected local bit line LBL1 is set in, for example, 1 to 1.5 V. When a certain charge level is achieved, the local bit line selection signal BK2 is made low-level and the local bit line selection transistor 11b is turned off to stop charging of the local bit line LBL2. In accordance with the above processing procedure, a current route is formed which extends from a charging circuit to the global bit line GBL1, local bit line LBL1, variable resistive element 2A, selection transistor 3A, and source line SL. In this case, an input voltage of a comparator circuit 9 is decided by a bit line current decided in accordance with the load characteristic of the load circuit 8 and the resistance value of the variable resistive element 2A. Operations of the comparator circuit 9 are the same as those of the prior art shown in FIG. 20.

As shown in FIG. 5, the variable resistive element 2B not to be read is connected to the drain of the selection transistor 3A. However, because the local bit line selection signal BK2 is kept at low level and the local bit line selection transistor 11b is turned off, the current route passing through the variable resistive element 2A is not influenced.

The number of the memory cells 1 connected to a common local bit line LBL along the column direction has an upper limit value because of circuit operations and the upper limit value is decided in accordance with each resistance value decided correspondingly to the stored data of the variable resistive element 2 (or in accordance with the resistance value of data 0 and that of data 1 when storing binary data) and the on-state resistance of the selection transistor 3. This is caused by the fact that a leak current route is formed between a pair of local bit lines LBL1 and LBL2 through two variable resistive elements 2 of an unselected memory cell 1. However, as described above, by charging a pair of local bit lines LBL1 and LBL2, it is possible to reduce the influence of the leak current route.

(Third Embodiment)

Figure 7:
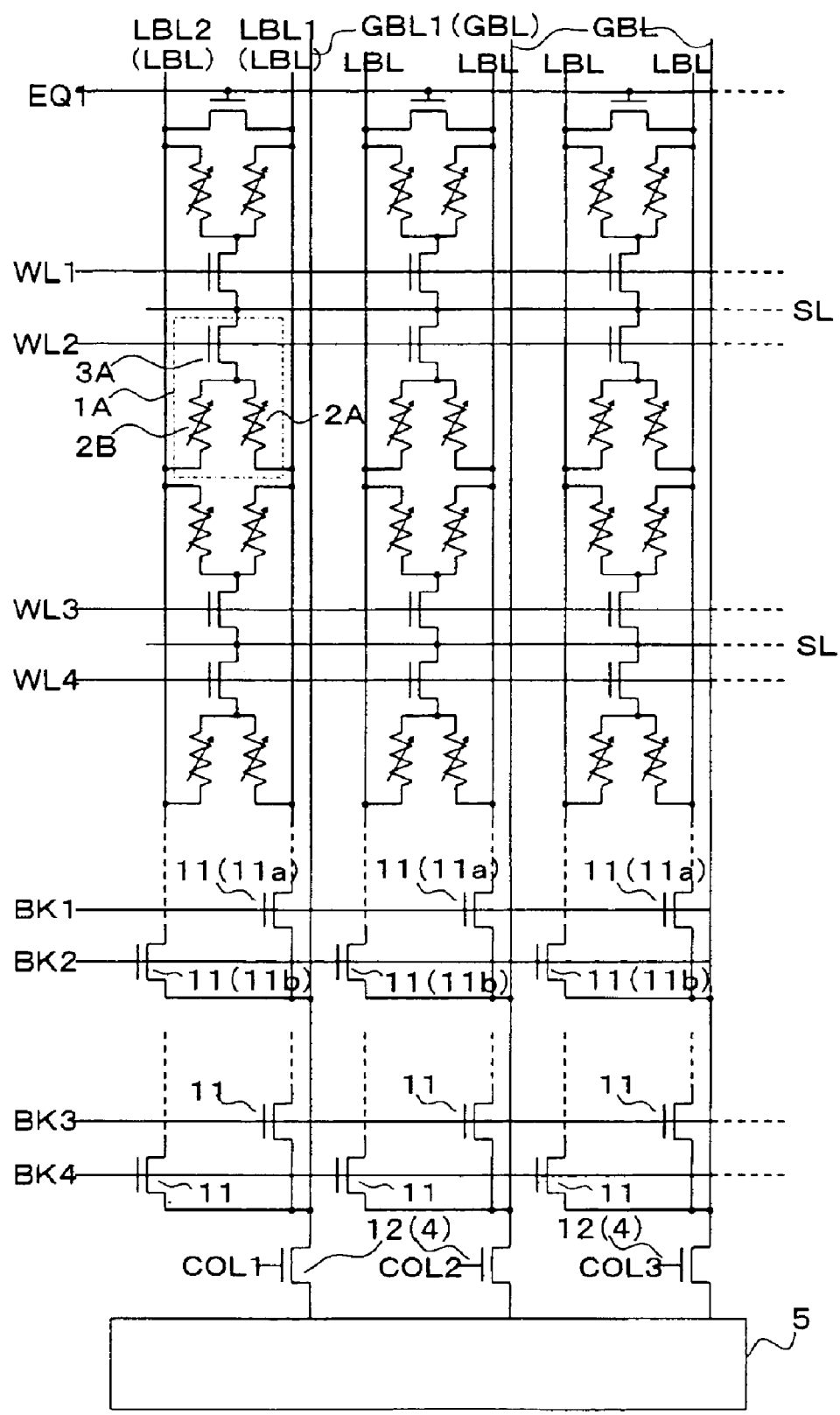
FIG. 7 is a circuit block diagram showing another configuration (third embodiment) of a memory array using a hierarchical bit line structure of a nonvolatile semiconductor memory device of the present invention.
Figure 8:
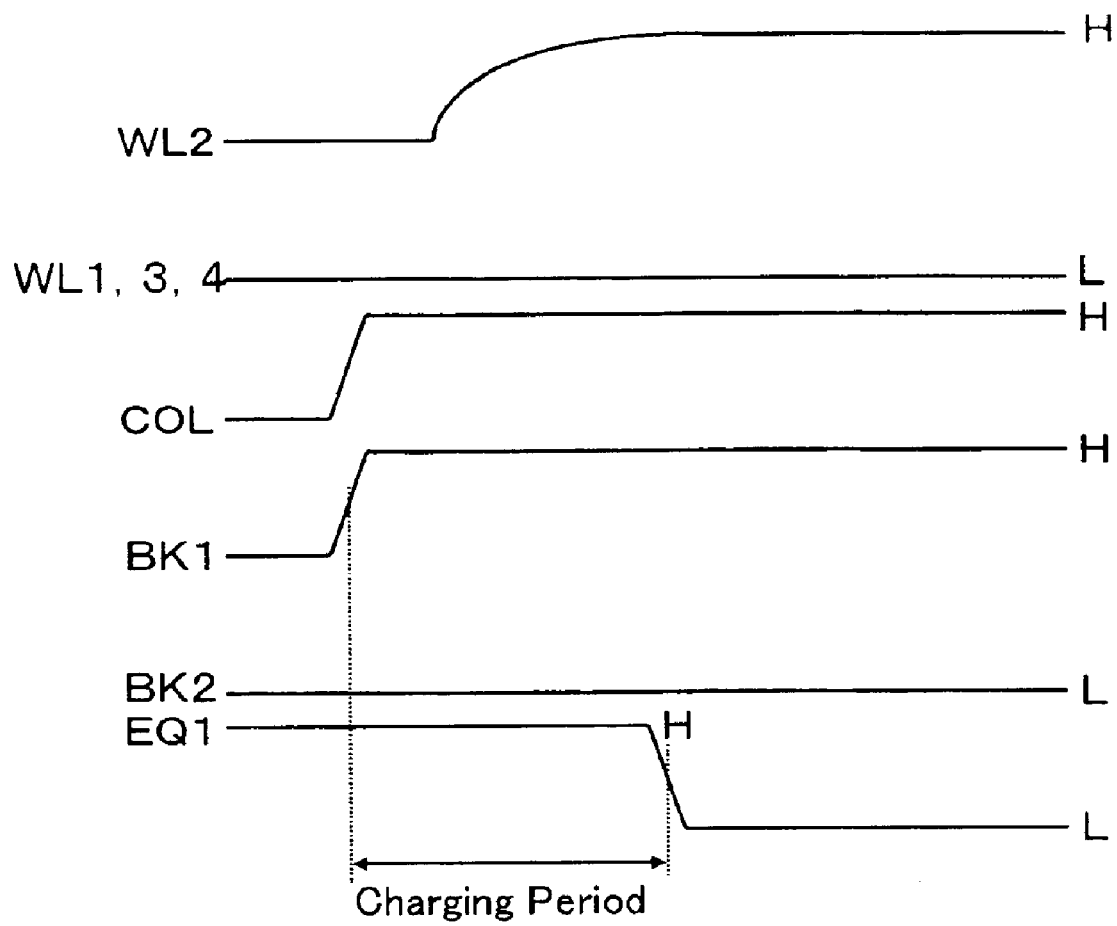
FIG. 8 is a signal timing waveform diagram for explaining the reading operation of the memory array configuration shown in FIG. 7.

FIG. 7 shows a third embodiment of the present invention. The third embodiment is different from the second embodiment in that a transistor 13 for equalizing potentials of a pair of local bit lines LBL1 and LBL2 is connected to the local bit lines LBL1 and LBL2 connected to the same memory cell 1. As shown by the signal timing waveform diagram in FIG. 8, the local bit line selection signal BK2 is temporarily made high-level during the charge period in the case of the second embodiment. In the case of the third embodiment, however, the local bit line selection signal BK2 is kept at low level and instead, an equalizing signal EQ1 is made high-level during the charge period and an equalizing transistor 13 is turned on to charge the local bit line LBL2. Though only a method for charging a pair of local bit lines LBL1 and LBL2 is different, other operations are the same as the case of the second embodiment.

(Fourth Embodiment)

Figure 9:
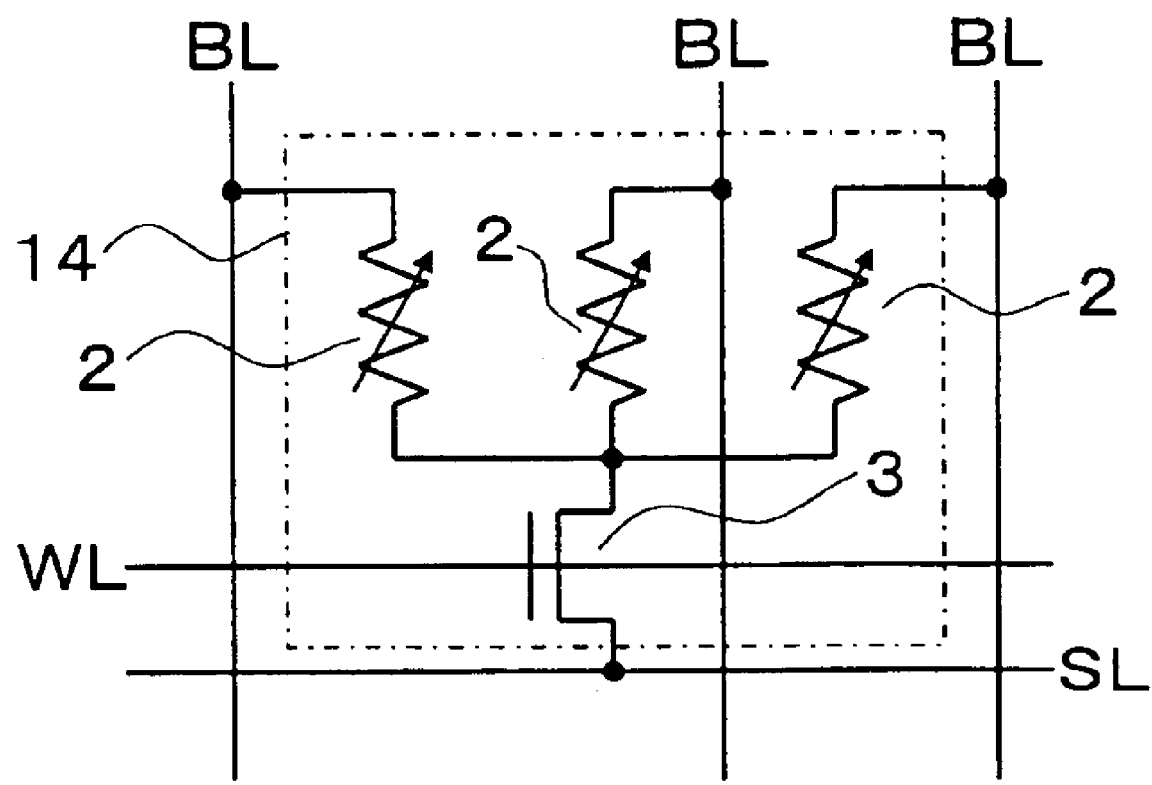
FIG. 9 is a circuit diagram showing another memory cell configuration (fourth embodiment) of a nonvolatile semiconductor memory device of the present invention.
Figure 10:
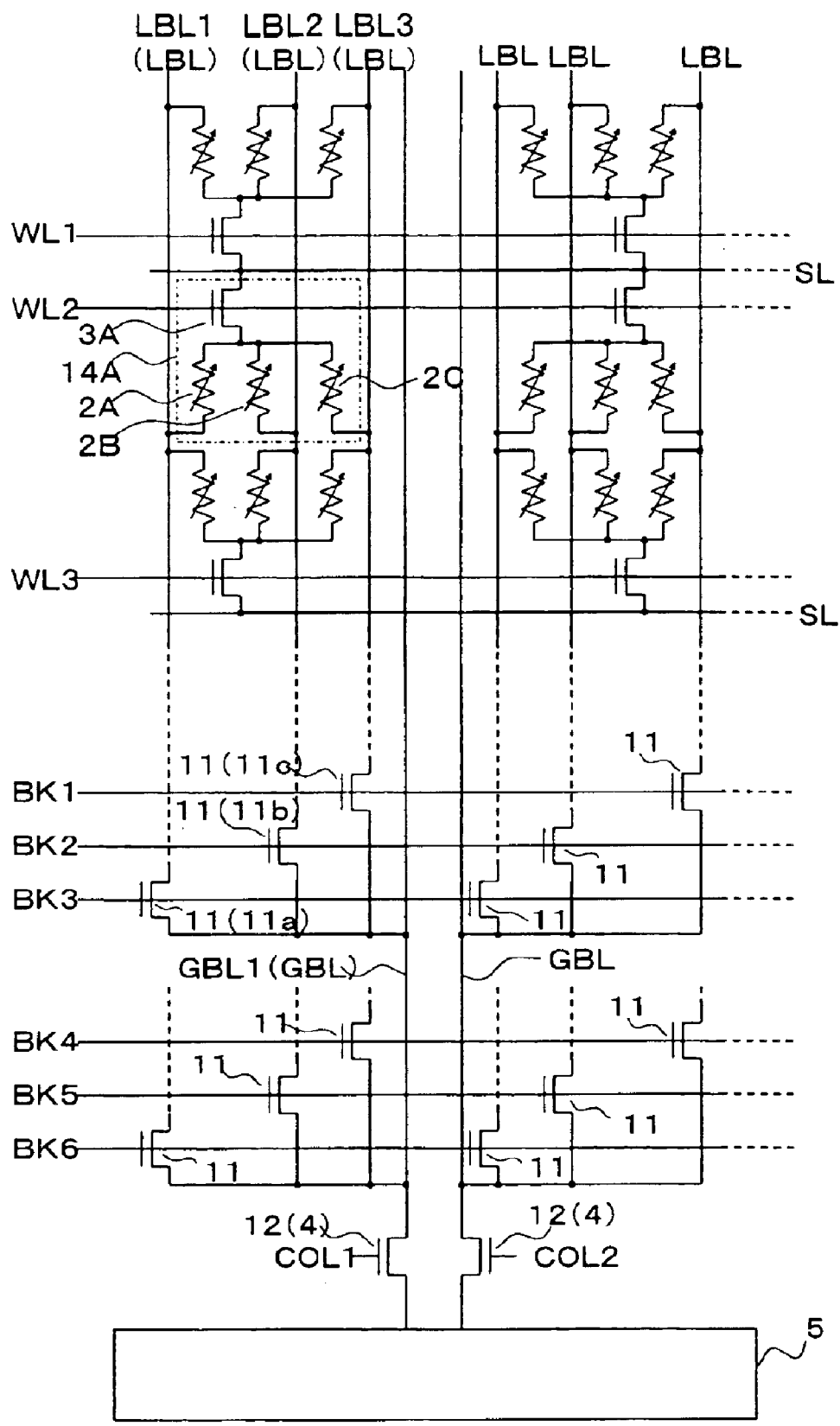
FIG. 10 is a circuit block diagram showing another configuration (fourth embodiment) of a memory cell array using a hierarchical bit line structure of a nonvolatile semiconductor memory device of the present invention.

FIGS. 9 and 10 show a fourth embodiment of the present invention. The memory cell configuration shown in FIG. 9 has three variable resistive elements 2 and a selection transistor 3 constituted by one MOSFET serving as a selection element for selecting the three variable resistive elements 2, in which one end of each variable resistive element 2 is connected with the drain electrode of the selection transistor 3. Moreover, the other end of each variable resistive element 2 is connected with a different bit line BL. The gate of the selection transistor 3 is connected to a word line WL and the source of the selection transistor 3 is connected to a source line SL. In the case of this embodiment, one memory cell 14 includes three variable resistive elements 2. Therefore, there is a memory capacity three times larger than that of the conventional memory cell shown in FIG. 17. However, when relating one memory cell to one variable resistive element 2, it can be said that the memory cell 14 of this embodiment is constituted by uniting three memory cells into one body. FIG. 10 shows a memory array configuration of a hierarchical bit line structure using the memory cell 14 shown in FIG. 9.

The fourth embodiment is different from the second embodiment shown in FIG. 4 only in the number of variable resistive elements 2 sharing one selection transistor 3, in which reading can be made the same as the case of the second embodiment by controlling local bit line selection transistors 11a, 11b, and 11c. A reading circuit 5 has a circuit configuration same as that shown in FIG. 5.

Specifically, in FIG. 10, when assuming a memory cell 14 to be read as 14A, a variable resistive element 2 to be read in the memory cell 14 as 2A, variable resistive elements 2 not to be read as 2B and 2C, and a selection transistor 3 of the memory cell 14A as 3A, local bit line selection signals BK1, BK2, and BK3 are made high-level in order to turn on local bit line selection transistors 11a, 11b, and 11c which connect to a local bit line LBL1 connected to the variable resistive element 2A, a local bit line LBL2 connected to the variable resistive element 2B, and a local bit line LBL3 connected to the variable resistive element 2C, respectively. At the same time, in order to turn on the selection transistor 3A, a word line WL2 is made high-level. A source line SL connected to the memory cell 14A is set to the ground potential and a global bit line selection signal COL1 is made high-level in order to turn on a global bit line selection transistor 12 so as to select a global bit line GBL1 connected to the local bit lines LBL1, LBL2, and LBL3 through the local bit selection transistors 11a, 11b, and 11c. Under the above state, the selected global bit line GBL1 and local bit lines LBL1, LBL2, and LBL3 are charged from a load circuit 8 in the reading circuit 5. The reading charge level to the selected local bit line LBL1 is set to, for example, 1 to 1.5 V. When a certain charge level is reached, the local bit line selection signals BK2 and BK3 are made low-level and the local bit line selection transistors 11b and 11c are turned off to stop charging the local bit lines LBL2 and LBL3. According to the above processing procedure, a current route is formed which extends from a charging circuit to the global bit line GBL1, local bit line LBL1, variable resistive element 2A, selection transistor 3A, and source line SL and an input voltage of a comparator circuit 9 is decided by a bit line current decided by the load characteristic of the load circuit 8 and the resistance value of the variable resistive element 2A and the reading operation is executed by the comparator circuit 9.

Figure 11A:
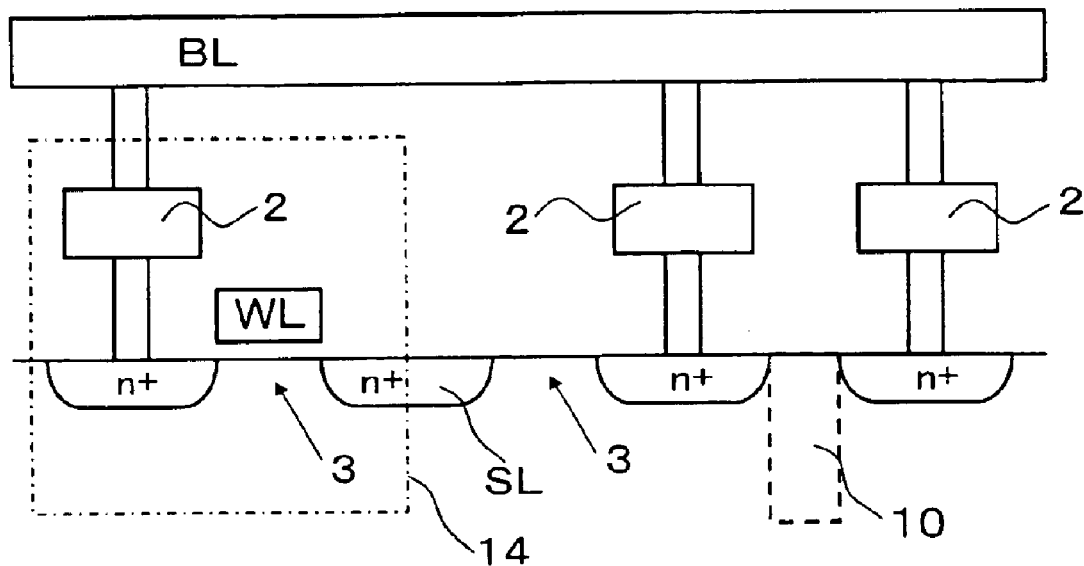
FIG. 11A is a sectional view schematically showing a cross section of an essential portion of the memory array configuration shown in FIG. 10 taken along the line A—A in FIG. 10.
Figure 11B:
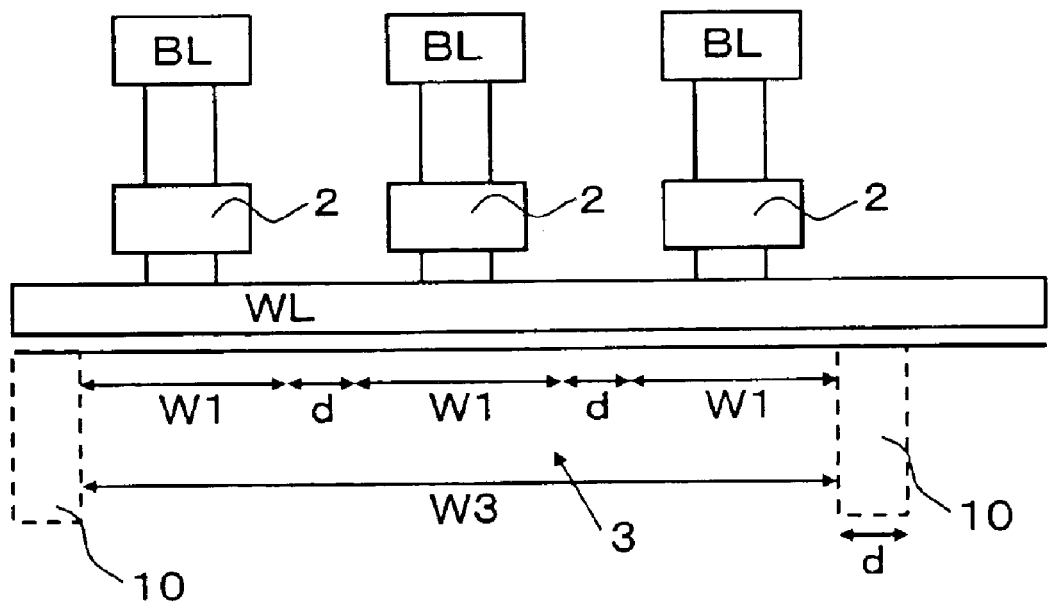
FIG. 11B is a sectional view schematically showing a cross section of an essential portion of the memory array configuration shown in FIG. 10 taken along the line B—B in FIG. 10.

FIG. 11 schematically shows a sectional view of an essential portion of the memory array configuration shown in FIG. 10. From FIG. 11, it is found that the gate width (W3=3×W1+2×d) of the selection transistor 3 can be further increased.

For the fourth embodiment, a case is described in which one selection transistor 3 is connected with three variable resistive elements 2. However, it is also allowed that four or more variable resistive elements 2 sharing one selection transistor 3 are used in one memory cell. In this case, the gate width of the selection transistor 3 is further increased.

(Fifth Embodiment)

Figure 12:
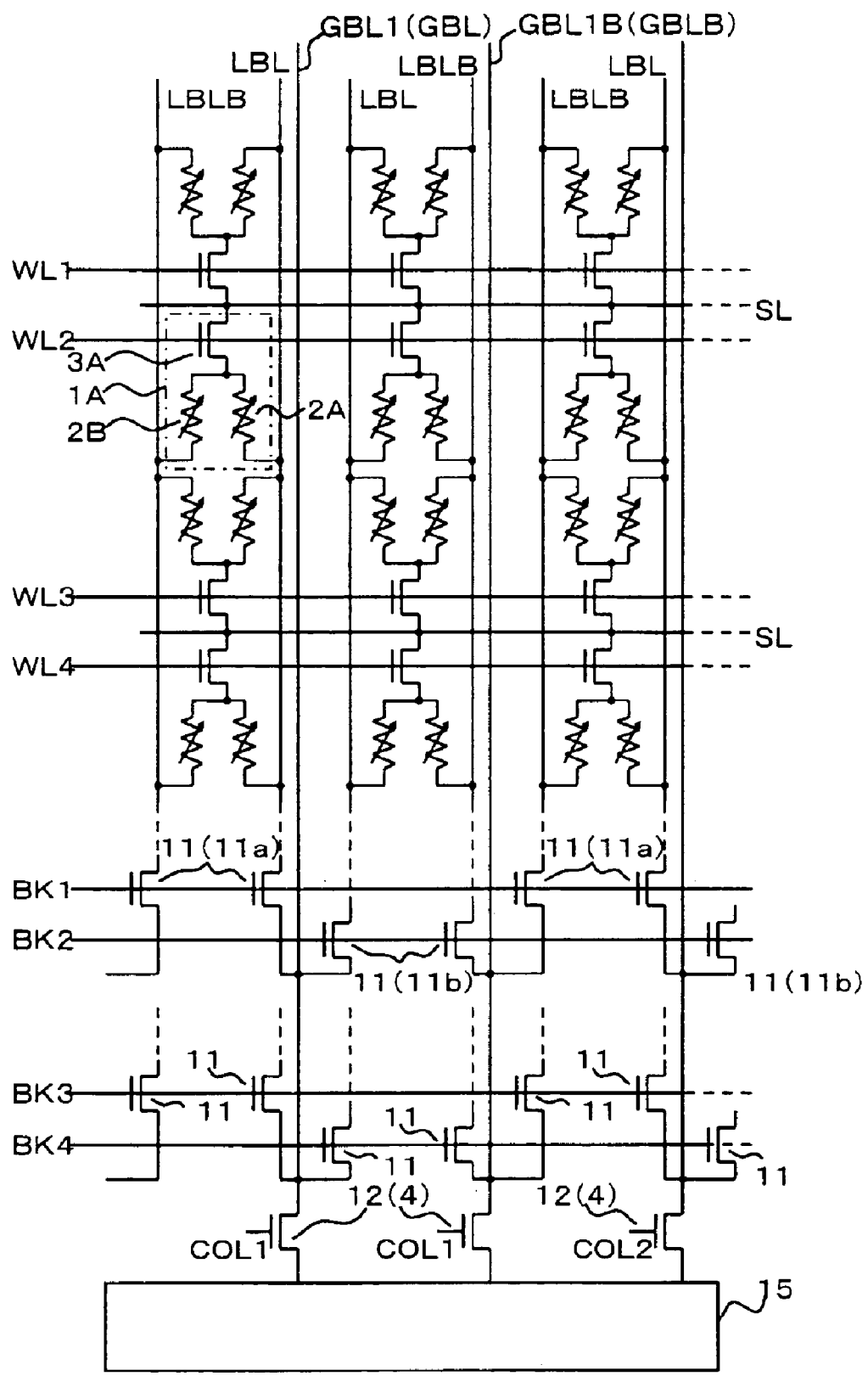
FIG. 12 is a circuit block diagram showing still another configuration (fifth embodiment) of a memory cell array using a hierarchical bit line structure of a nonvolatile semiconductor memory device of the present invention.
Figure 13:
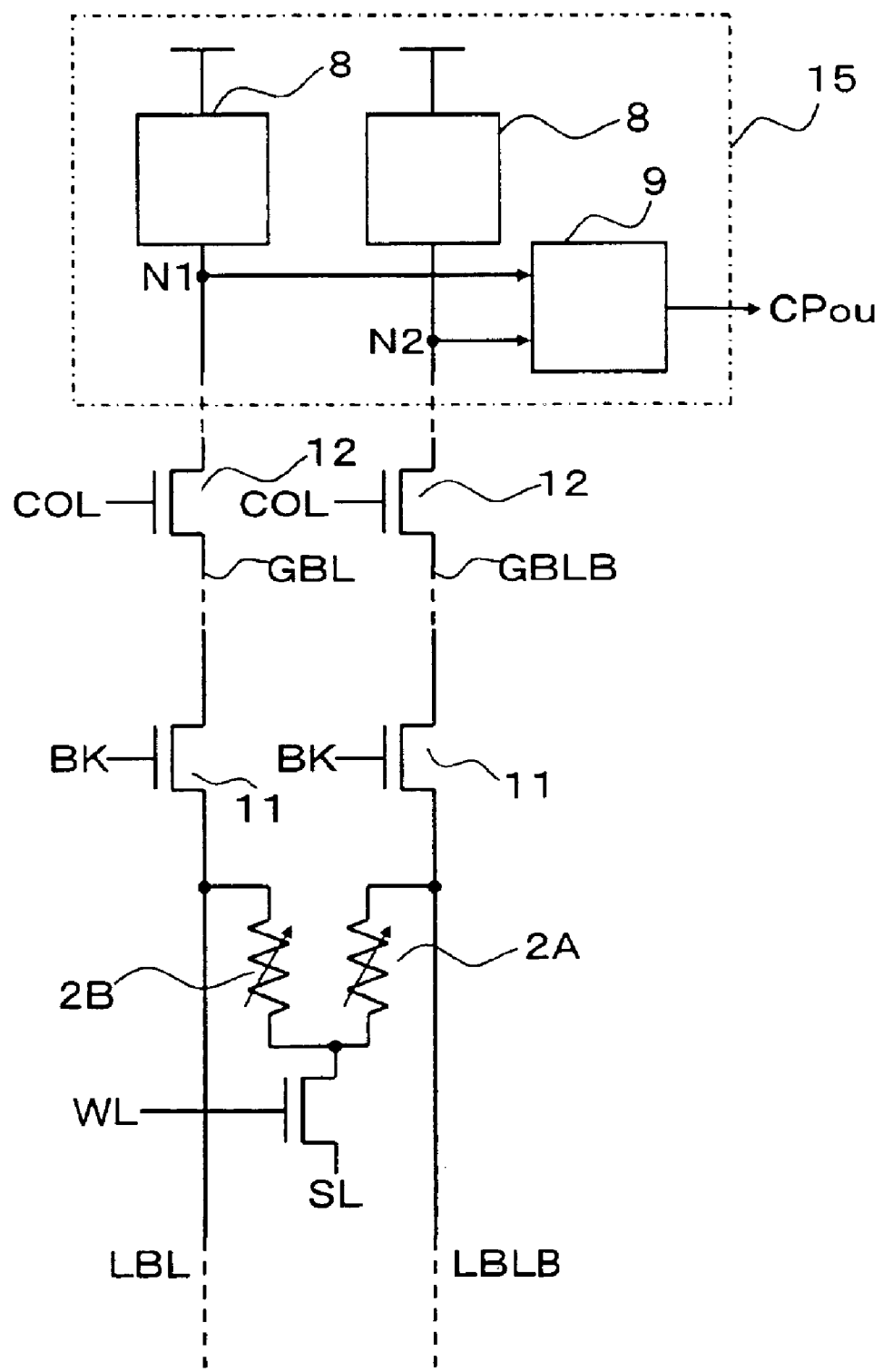
FIG. 13 is a circuit block diagram showing a reading circuit of the memory array configuration shown in FIG. 12.

FIG. 12 shows a fifth embodiment of the present invention. In the case of the fifth embodiment, a circuit for reading resistance values of two variable resistive elements 2 in one memory cell 1 shown in FIG. 1 by using a pair of bit lines (local and global bit lines) connected to the two variable resistive elements 2 is constituted by using the memory cell 1. For example, when storing one-bit data (binary data) in one memory cell, one variable resistive element 2 has a high resistance and the other variable resistive element 2 has a low resistance, a pair of bit lines (local and global bit lines) are charged, a difference is produced between bit line currents at positive or negative polarity depending on which one of the variable resistive elements 2 has a high resistance (or low resistance) to read data by the reading circuit 15 shown in FIG. 13. A configuration of the reading circuit 15 is different from configurations of the reading circuits 5 of the first to fourth embodiments and voltages of nodes N1 and N2 decided by bit line currents circulating through the above bit lines are input to a comparator circuit 9 but a reference voltage Vref for reference is not used.

Thus, because two bit lines are used, the relation between a local bit line LBL and a global bit line GLB is different from the case of the second to fourth embodiment. That is, in the case of the first to fourth embodiments, a local bit line connected to the same memory cells 1 and 14 is connected to one global bit line. In the case of the fifth embodiment, however, a pair of local bit lines of the same memory cell 1 are connected to a pair of global bit lines respectively and one global bit line is shared by local bit lines of memory cells adjacent each other.

Another embodiment is described below.

Figure 14:
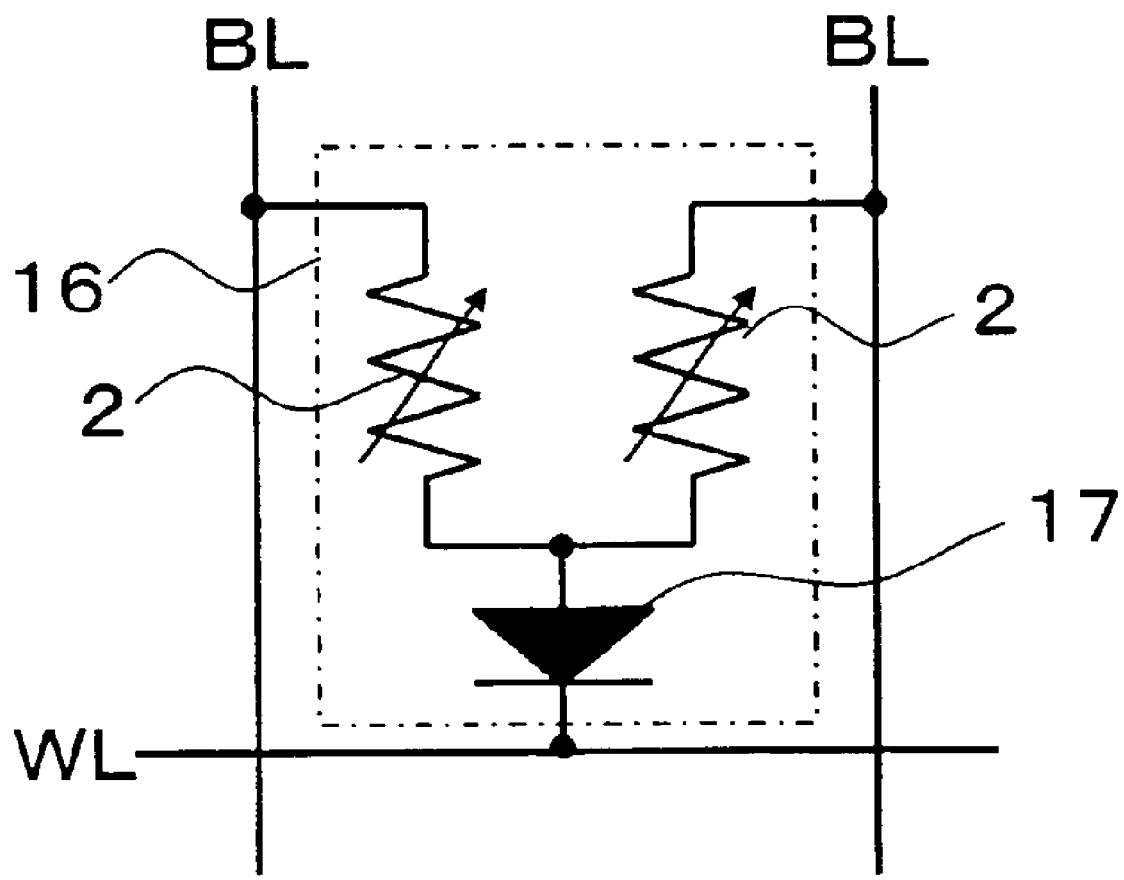
FIG. 14 is a circuit diagram showing another memory cell configuration (another embodiment) of a nonvolatile semiconductor memory device of the present invention.
Figure 15:
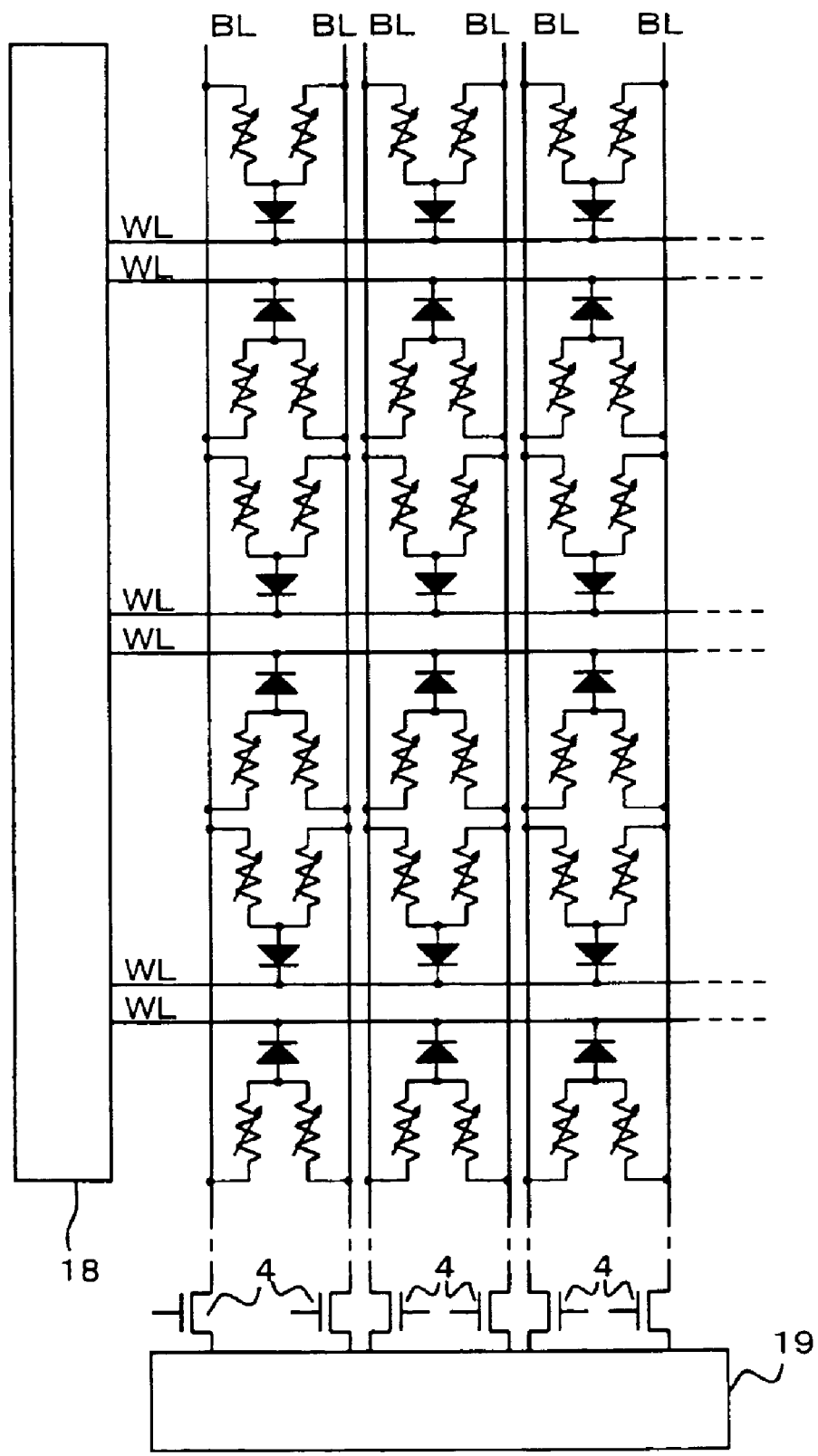
FIG. 15 is a circuit diagram showing another configuration (another embodiment) of a memory array using a hierarchical bit line structure of the present invention.
Figure 16:
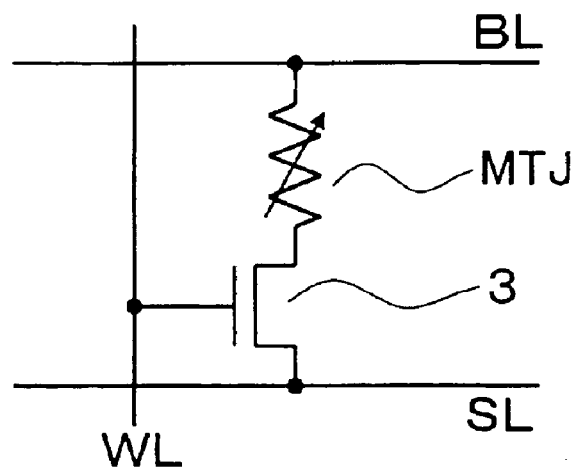
FIG. 16 is a circuit diagram showing a memory cell configuration using an MTJ device of a conventional nonvolatile semiconductor memory device.

In the case of each of the above embodiments, the memory cells 1 and 14 respectively use the selection transistor 3 constituted by a MOSFET as a selection element. For example, as shown in FIG. 14, however, it is also allowed to constitute a memory cell 16 by using a diode element 17 instead of the selection transistor 3. Specifically, the memory cell includes, two variable resistive elements 2 and one diode element 17 serving as a selection element for selecting the two variable resistive elements and one ends of the variable resistive elements 2 are respectively connected with the anode of the diode element 17. Moreover, the other ends of the variable resistive elements 2 are respectively connected with different bit lines BL and the cathode of the diode element 17 is connected to a word line WL. FIG. 15 shows a memory array configuration. Also in the case of this another embodiment, because it is possible to increase the setting area of the diode element 17 the same as the case of the selection transistor 3, the same advantage as the case of using the selection transistor 3 can be expected.

Figure 21:
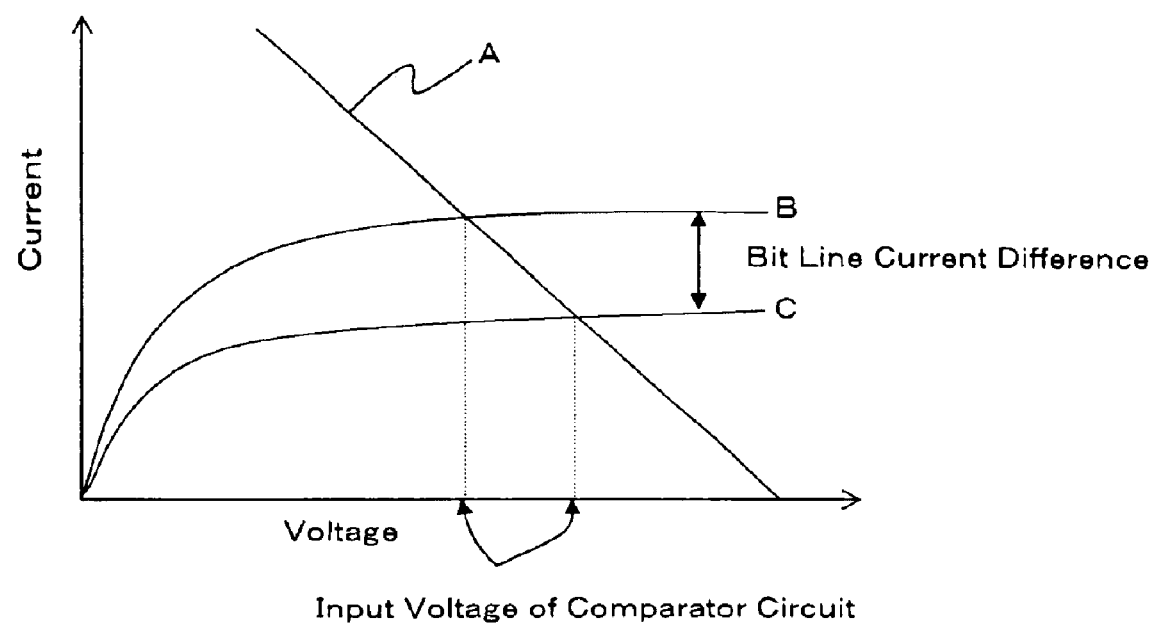
FIG. 21 is a graph showing a current-voltage characteristic of a bit line current and a load characteristic.
Figure 22:
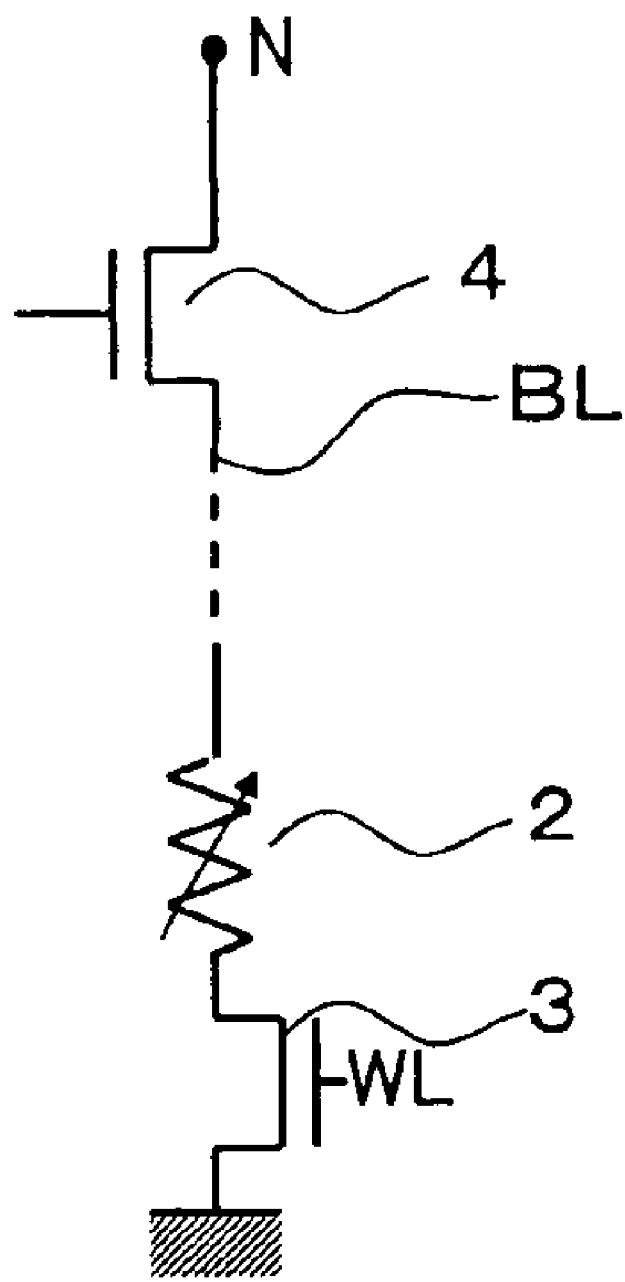
FIG. 22 is a circuit diagram showing a simple model of a bit line current route of a conventional nonvolatile semiconductor memory device.

For each of the above embodiments, a case of using an RRAM element as the variable resistive element 2 is described as an example. However, it is also allowed to use an MRAM element or OUM element instead of the RRAM element. The MRAM element and OUM element are different from the RRAM element in that electrical resistances are changed by a magnetic field or heat. However, the MRAM element and OUM element are the same as the RRAM element in that they are variable resistive elements respectively capable of storing information in accordance with a change of electrical resistances. Therefore, the MRAM and OUM elements respectively show the current-voltage characteristic of the bit line current shown in FIG. 21, depending on a resistance value which can be taken correspondingly to the data to be stored and the improvement effect is expected that the reading operation is accelerated and stabilized the same as the case of the above embodiments.

As described above, according to the present invention, it is possible to decrease the on-state resistance of a memory cell selection element (selection transistor and diode element) without increasing the whole area of a memory array and provide a nonvolatile memory cell and a nonvolatile semiconductor memory device capable of accelerating and stabilizing the reading operation of data stored in a memory cell.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. A nonvolatile semiconductor memory device, comprising:
   a memory cell array; wherein the memory cell array is constituted by arranging a plurality of memory cells comprising:
      a plurality of variable resistive elements capable of storing information in accordance with a chance of electrical resistances; and
      a selection element for selecting the variable resistive elements in common; wherein
      one ends of the variable resistive elements are connected each other, and
      an electrode of the selection element is connected with one end of each of the variable resistive elements;
   the memory cells arranged like a matrix in a row direction and column direction and moreover, a word line is included in each row of the memory cells along the row direction, and bit lines extending alone a column direction in each column and equal to the number of the variable resistive elements in the memory cells are included; and
   wherein a hierarchical bit line structure is used in which at least a plurality of blocks is arranged in the column direction by using the memory cell array as one block, the bit line of each block is used as a local bit line, a local bit line selection transistor for selecting the local bit line is set, and the local bit line is connected to a global bit line through the local bit line selection transistor.

2. A nonvolatile memory cell, comprising:
   a first and a second variable resistive element, each capable of storing information in accordance with a variance in electrical resistance, each variable resistive element having a first end and a second end, the first ends coupled;
   the second end of the first variable resistive element coupled with a first bit line, and the second end of the second variable resistive element coupled with a second bit line;
   one of a source and a drain of a transistor coupling with the first bit line and the other of the source and the drain coupling with the second bit line; and
   a selection element for selecting the first and the second variable resistive element in common, the selection element having a first electrode coupled with the first ends.

3. The nonvolatile memory cell according to claim 2, wherein each of the variable resistive elements is one of an RRAM element, an MRAM element, and an OUM element.

4. The nonvolatile memory cell according to claim 2, wherein the selection element is a MOSFET and the first electrode of the selection element is one of a source and a drain, the selection element further comprising a gate.

5. The nonvolatile memory cell according to claim 4, wherein the first bit line and the second bit-line are disposed substantially parallel to each other a predetermined distance apart, and wherein the gate of the selection element is disposed substantially perpendicular to the first and the second bit lines, the gate having a width at least as great as a sum of a width of the first bit line, a width of the second bit line, and the predetermined distance.

6. The nonvolatile memory cell according to claim 2, wherein the selection element is a diode, and wherein the first electrode of the selection element is one of an anode and a cathode.

7. A nonvolatile memory cell array, comprising:
   a first and a second memory cell, each memory cell comprising:
      a first and a second variable resistive element, each variable resistive element capable of storing information in accordance with a variance in electrical resistance, each having a first end and a second end, the first ends coupled, the second end of the first variable resistive element coupled with a first bit line, and the second end of the second variable resistive element coupled with a second bit line; and
      a selection element for selecting the first and the second variable resistive elements in common; and
   a first global bit line coupling with the second bit line of the first memory cell and the first bit line of the second memory cell.

8. The nonvolatile memory cell array according to claim 7, wherein
   the selection element of the first and the second memory cells is one of a MOSFET and a diode.

9. The nonvolatile memory cell array according to claim 8, wherein the differential comparator generates a result for output without reference to a reference voltage.

10. The nonvolatile memory cell array according to claim 7, wherein the first global bit line couples with the second bit line through a first transistor and with the first bit line through a second transistor.

11. The nonvolatile memory cell array according to claim 7, further comprising:
   a second global bit line, the second global bit line coupling with the second bit line of the second memory cell;
   a differential comparator circuit for outputting a result, the first and the second global bit lines inputting to the comparator circuit.

12. The nonvolatile memory cell array according to claim 11, further comprising:
   a third memory cell, the third memory cell comprising:
      a first and a second variable resistive element, each variable resistive element capable of storing information in accordance with a variance in electrical resistance, each having a first end and a second end, the first ends coupled, the second end of the first variable resistive element coupled with a first bit line, and the second end of the second variable resistive element coupled with a second bit line; and
      a selection element for selecting the first and the second variable resistive elements in common;
   a third global bit line coupling with the second bit line of the third memory cell; and wherein the second global bit line couples with the first bit line of the third memory cell.

13. The nonvolatile semiconductor memory device according claim 7, wherein each of the variable resistive elements is one of an RRAM element, an MRAM element, and an OUM element.

* * * * *